United States Patent
Yee et al.

(10) Patent No.: US 11,984,774 B2
(45) Date of Patent: May 14, 2024

(54) DRIVE MODULE FOR MOTOR-DRIVE SYSTEMS

(71) Applicant: Rockwell Automation Technologies, Inc., Mayfield Heights, OH (US)

(72) Inventors: Kristin N. Yee, Mequon, WI (US); Barbara Grosek, Świętochłowice (PL); Piotr Hilary Krawiec, Siemianowice Slaskie (PL)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 366 days.

(21) Appl. No.: 17/368,003

(22) Filed: Jul. 6, 2021

(65) Prior Publication Data
US 2023/0010828 A1   Jan. 12, 2023

(51) Int. Cl.
| | |
|---|---|
| *H05K 5/00* | (2006.01) |
| *H02K 11/00* | (2016.01) |
| *H02K 11/21* | (2016.01) |
| *H02K 11/33* | (2016.01) |

(52) U.S. Cl.
CPC ......... *H02K 11/33* (2016.01); *H02K 11/0094* (2013.01); *H02K 11/21* (2016.01)

(58) Field of Classification Search
CPC ....... H05K 5/0017; H02K 11/21; H02K 11/33
USPC ........ 361/728, 600, 730, 731, 752, 796, 800
See application file for complete search history.

(56) References Cited

U.S. PATENT DOCUMENTS

| | | | | |
|---|---|---|---|---|
| 10,186,991 B2 * | 1/2019 | Schroedel | .............. | H02K 11/33 |
| 2013/0301328 A1 * | 11/2013 | Ito | ........................... | B60L 3/003 |
| | | | | 363/141 |
| 2017/0187267 A1 * | 6/2017 | Krah | ...................... | H02K 9/227 |
| 2023/0170765 A1 * | 6/2023 | Vrankovic | ........... | H05K 7/2089 |
| | | | | 310/64 |

FOREIGN PATENT DOCUMENTS

| | | |
|---|---|---|
| EP | 1404000 A1 | 3/2004 |
| EP | 1950870 A2 | 7/2008 |
| EP | 2330720 A1 | 6/2011 |

OTHER PUBLICATIONS

Extended European Search Report for Application No. 22182813.0 dated Nov. 30, 2022, 9 pages.

* cited by examiner

*Primary Examiner* — Hung S. Bui
(74) *Attorney, Agent, or Firm* — Fletcher Yoder, P.C.

(57) ABSTRACT

The present disclosure includes drive modules for motor-drive assemblies of an industrial automation system. The drive modules may include a housing having a cavity and may also include power circuitry and control circuitry. The power circuitry may convert input DC power to three-phase controlled frequency AC power and may supply the three-phase controlled frequency AC power to a motor. The control circuitry may apply control signals to control operation of the motor. The drive module may also include an adapter that couples to a first end of the housing and couples the housing to the motor. The adapter may be removable and sized according to a frame size of the motor such that the drive module is compatible with the motor. The housing may be independent of the frame size of the motor. As such, the housing may be interchangeable for any motor frame size and/or motor power.

19 Claims, 6 Drawing Sheets

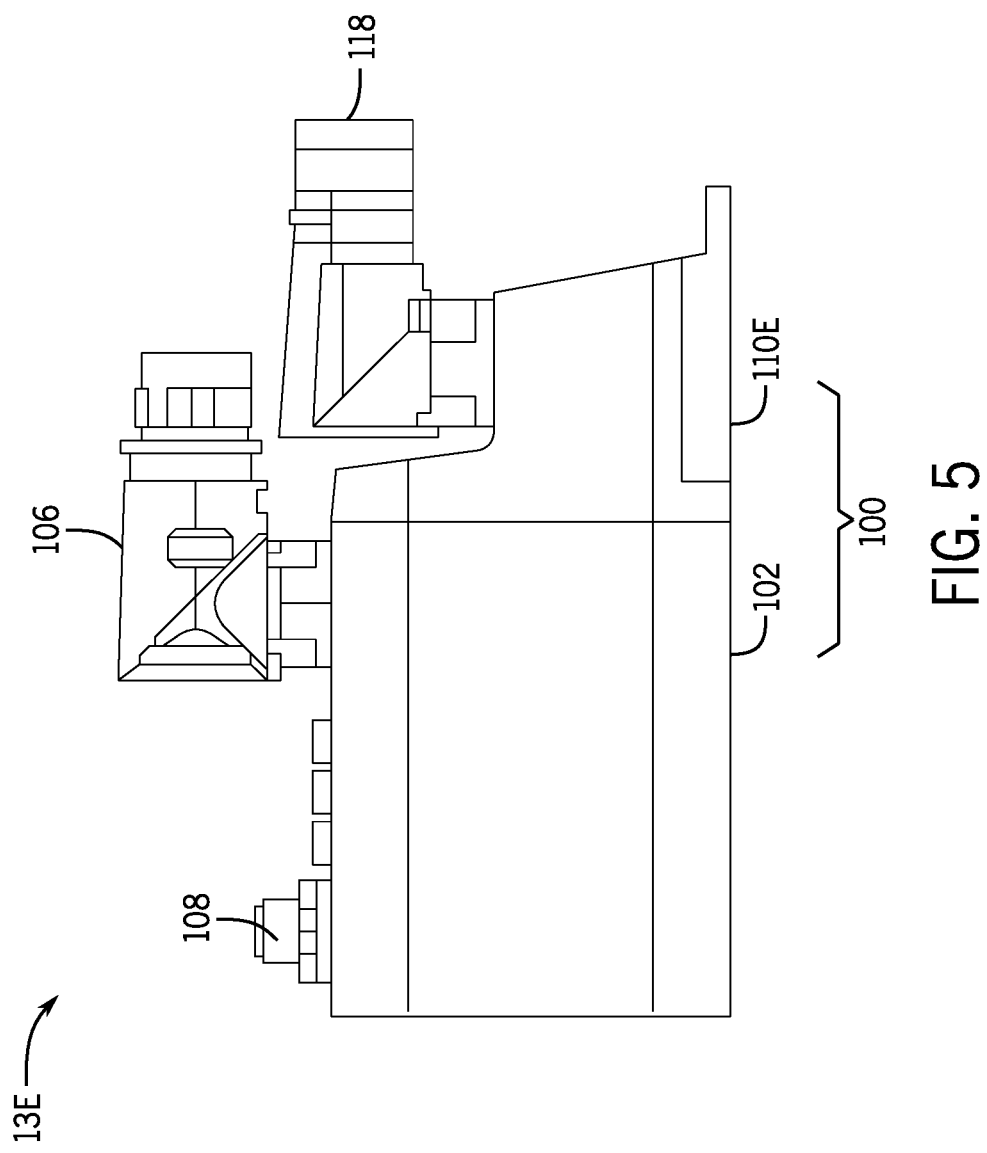

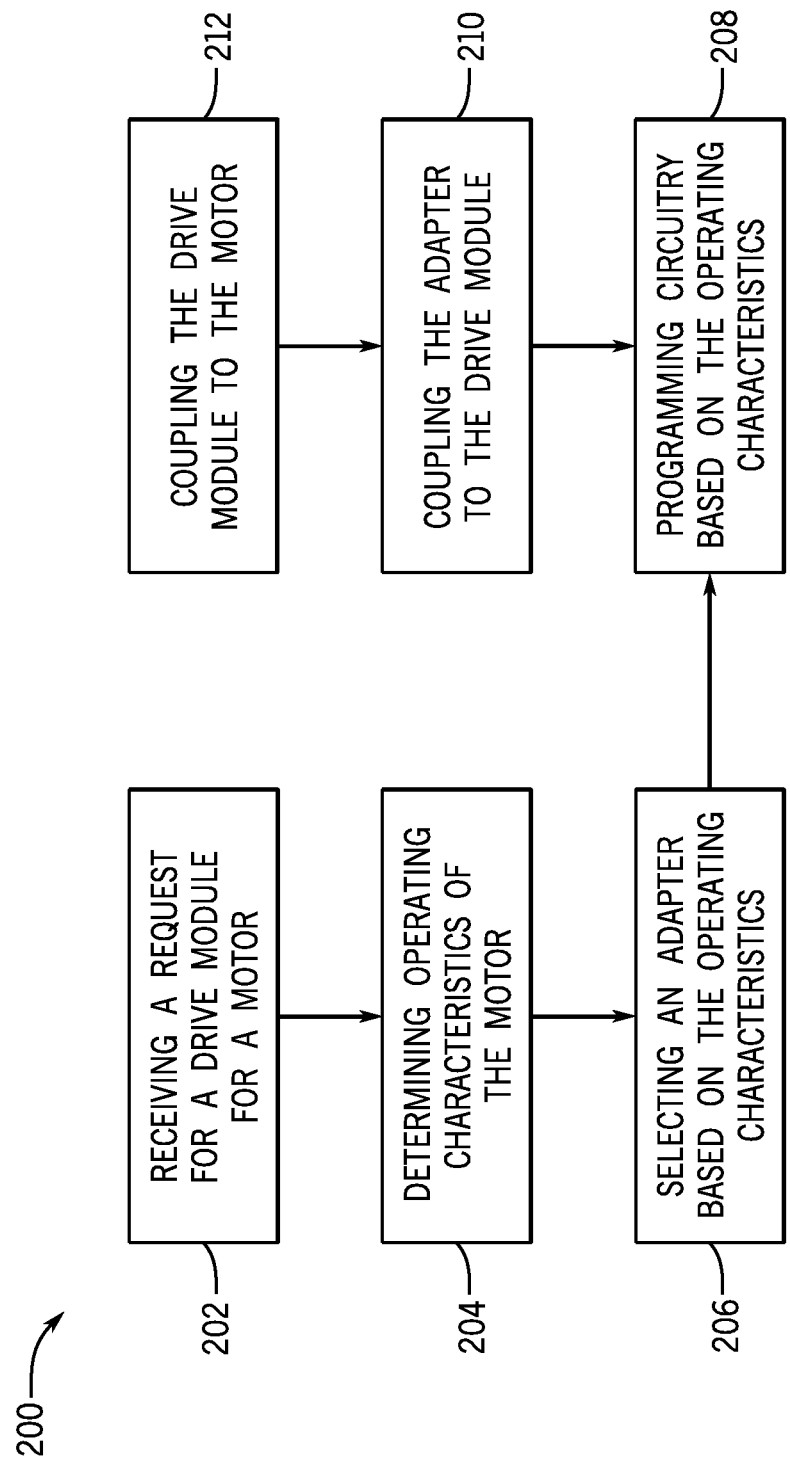

DRIVE MODULE FOR MOTOR-DRIVE SYSTEMS

BACKGROUND

The present disclosure relates generally to drive modules, and more particularly, to uniform drive modules for use in a motor-drive system, which may be part of an industrial automation system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

A wide range of systems in industry and other applications utilize automated control by actuating loads, such as electric motors. In motor-drives, for example, sophisticated control circuitry allows for implementation of control schemes that produce variable frequency output to drive motors at desired speeds. The motor-drives may be designed around individual packages, based on the power output of the motor or frame size, that can be programmed and wired to receive input power as well as to output conditioned power to the electric motor. Such packaged products typically include power condition circuitry that receives AC input and converts the AC input to a DC form, before reconverting the DC power to controlled frequency AC output. However, many products are designed to power specific sizes of motors (typically rated by the power output and/or frame size) and may only interface with a single size of motor. Accordingly, customers may have limited flexibility in using an existing motor-drive with different sized motors. Further, manufacturers and vendors of industrial automation systems may keep a larger inventory of motor-drives on hand to be compatible with a range of motor sizes. As such, motor-drives being designed to be compatible with specific motor sizes may result in increased cost, limited flexibility, and inventory-related inefficiencies.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In an embodiment, a drive module for a motor-drive assembly includes a housing having a cavity. The drive module also includes power circuitry disposed within the cavity. The power circuitry may convert input DC power to three-phase controlled frequency AC power and may supply the three-phase controlled frequency AC power to a motor. The drive module also includes control circuitry disposed within the cavity. The control circuitry may apply control signals to control operation of the motor. The drive module may also include a housing extension that may couple to a first end of the housing and may couple the housing to the motor. The housing extension may be removable and sized according to a frame size of the motor. The drive module may also include a hybrid connector including a power interface and a data interface. The power interface may transfer power to the motor and the data interface may transfer data signals to an external device.

In another embodiment, a motor-drive assembly includes a motor and a drive module mounted in-line with the motor. The drive module may include a housing having a cavity. The drive module may also include power circuitry. The power circuitry may convert incoming DC power to three-phase controlled frequency AC power and may supply the three-phase controlled frequency AC power to the motor. The power circuitry may be disposed in the cavity. The drive module may also include control circuitry disposed in the cavity. The control circuitry may apply control signals to control operation of the motor. The drive module may also include an adapter component. The adapter component may couple the drive module and the motor and may be configured according to a frame size of the motor.

In yet another embodiment, a method includes receiving a request for a drive module for a motor-drive assembly. The method also includes determining a set of operating characteristics associated with a motor of the motor-drive assembly. The method also includes selecting an adapter based on the operating characteristics and programming circuitry of the drive module based on the operating characteristics. The method also includes coupling the adapter to the drive module and coupling the drive module to the motor via the adapter.

DRAWINGS

These and other features, aspects, and advantages of the present disclosure will become better understood when the following detailed description is read with reference to the accompanying drawings in which like characters represent like parts throughout the drawings, wherein:

FIG. 5 is a perspective view of a second motor-drive assembly incorporating the drive module of FIG. 2, in accordance with embodiments described herein; and FIG. 6 is a flowchart of a process for selecting an adapter for a motor-drive assembly for a given motor, in accordance with embodiments described herein.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. As used herein, "in-line" refers to a longitudinal axis of a drive module or a component of a drive module arranged parallel with a rotational axis of a rotor of a motor. As used herein, "potting" refers to covering electronic components (e.g., circuitry) and/or filling an assembly containing electronic components with a solid or gelatinous material to prevent adverse environmental factors (e.g., water, moisture, corrosion, and so forth) and/or adverse effects from physical forces (e.g., impacts, shocks, vibrations, and so forth). As used herein, "power conversion" refers to converting alternating current into direct current, converting direct current into alternating current, altering a voltage of a current, or altering a frequency of a current, or any combination thereof.

Figure 1:
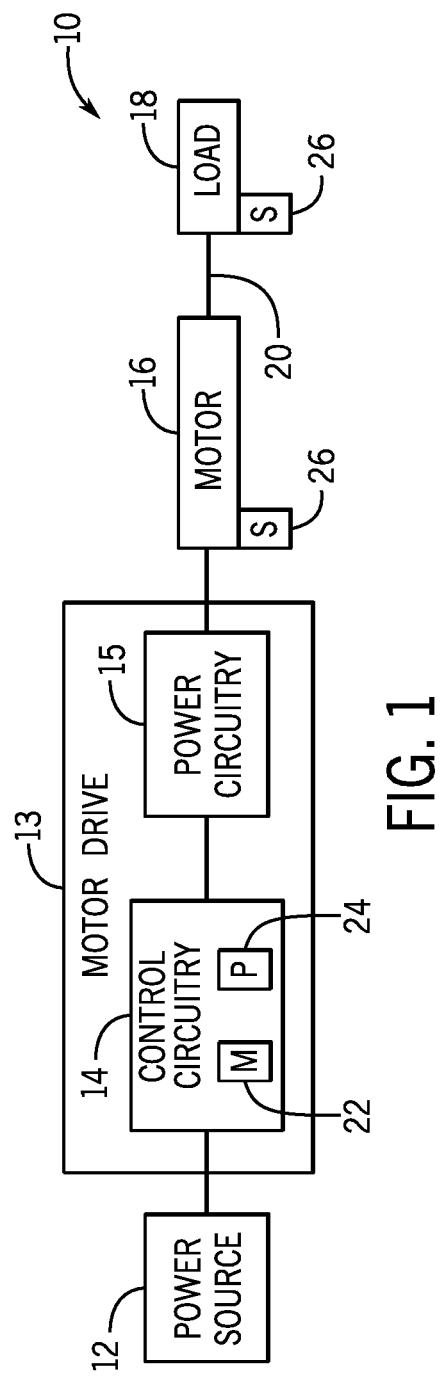
FIG. 1 is a schematic view of an industrial automation system, in accordance with embodiments described herein.

By way of introduction, FIG. 1 is a perspective view of an industrial automation system 10, including a power source 12, a motor-drive assembly 13, which includes control circuitry 14, power circuitry 15, a motor 16, and a load 18. In the instant embodiment, the industrial automation system 10 may include one or more motor-drive assemblies 13 coupled to one or more motors 16, which are then coupled to one or more loads 18. In such an embodiment, the motor-drive includes the control circuitry 14 and the power circuitry 15. The control circuitry 14, which may be used to control the motor-drive assemblies 13, may include various subcomponents, such as a non-transitory memory 22, a processor 24, a user interface, and the like. The power circuitry 15 may be configured to condition the power signal output by the control circuitry 14. For example, the power circuitry 15 may be configured to convert a signal from alternating current (AC) to direct current (DC), convert a signal from DC to AC, step a signal up, step a signal down, etc. The motor-drive assemblies 13 may also include various subcomponents, such as a rectifier, an inverter, driver circuitry, one or more switches, etc., that may be used to control the operation of the motor 16. The power source 12 may supply a regular voltage or high voltage AC signal provided by a utility power grid (e.g., a standard electrical outlet), a battery, a capacitor, a generator, or some other source of AC or DC electrical power. However, it should be understood that many possible embodiments are envisaged. For example, the control circuitry 14 may be any component configured to output a control signal (directly or indirectly) to the motor 16 or actuator in order to cause the actuator to move. Accordingly, the motor 16 may have mechanical and/or electrical components and may include a linear motor, a servo, a rotational electric motor, a combustion engine, a trolley, a mover, or any other component configured to move in response to a control signal. The load 18 may be any load that is moved by the motor 16. In some embodiments, the industrial automation system 10 may include sensors 26 disposed on the motor (e.g., an encoder), on the load 18, or both. The sensors 26 may be in communication with the control circuitry 14 and may transfer measurements to the control circuitry 14, which the control circuitry 14 may utilize to generate control signals.

Figure 2:
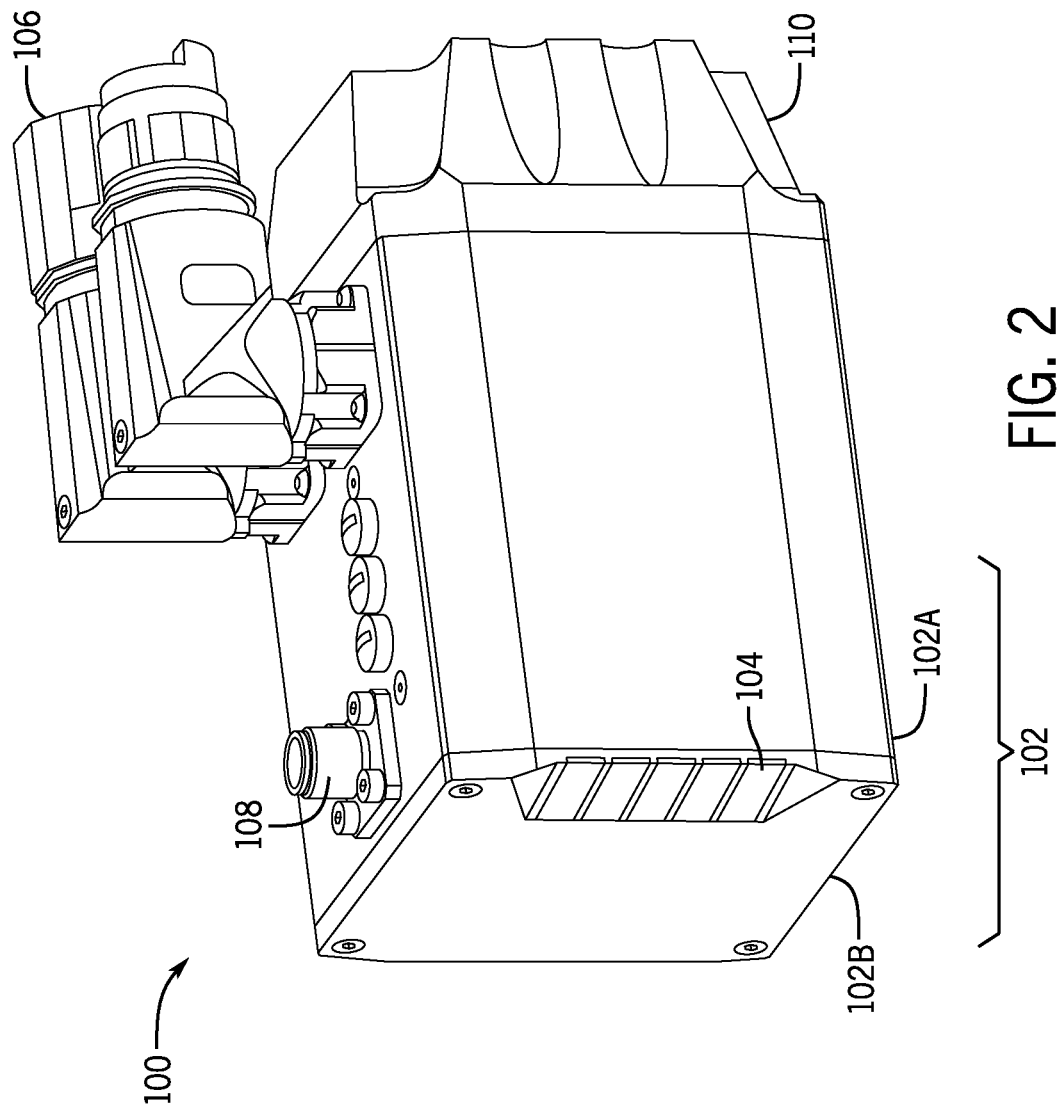
FIG. 2 is a perspective view of an exemplary drive module for a motor-drive of the industrial automation system of FIG. 1, in accordance with embodiments described herein.

FIG. 2 illustrates an example drive module 100 of a motor-drive, such as motor-drive assembly 13 for actuating an electric motor at controlled speeds. The drive module 100 may regulate output of the motor in terms of speed, torque, power, or a combination of such parameters. In a practical application, the motor would be coupled to a load to be driven to carry out industrial automation tasks (e.g., a pump, a conveyor, transmission equipment, and so forth). The drive module 100 may be part of an industrial automation system that automates entire groups of tasks, such as for manufacturing, material handling, mining, food processing, oil and gas extraction, refining, chemical processing, or any other useful application. Further, the industrial automation system may be physically and/or communicatively coupled with other systems by networks, both wired and wireless, at a single location or at dispersed locations in an organization.

As described further below, the drive module 100 may receive three-phase power from a power source, such as an electrical grid, a battery, a generator, etc., and may convert fixed frequency input power from the power source to controlled frequency output power. As such, the drive module 100 may manage application of electrical power to the loads, typically including various machines or motors. The drive module 100 may also collect data from the loads, from various sensors associated with the loads, from an industrial automation system associated with the load, and so forth. The collected data may be used in monitoring and control functions, and may include parameters such as current, voltage, speed, rotational velocity, temperatures, pressures, and so forth. The drive module 100 may be associated with a variety of components or other devices (not shown) used in the operation and control of the loads.

The drive module 100 may include a housing 102. The housing 102 may include any number of portions, such as body portion 102A and end cap portion 102B. The body portion 102A may have an interior cavity that houses drive circuitry for starting, driving, braking, actuating, and any suitable control of the motor, as described further below. The end cap portion 102B may be located at a first end of the body portion 102A and may be coupled to the body portion 102A (e.g., via fasteners, snaps, adhesives, etc.). In some embodiments, the end cap portion 102B may be formed of a metal material, molded plastic, etc. The end cap portion 102B may include a user interface 104, which may include one or more illuminating indicators, actuatable buttons or knobs, a display, a human-machine interface (HMI), and so forth, that may provide an indication of an operational state (e.g., on, off, starting, braking, fault, and so forth) of the drive module 100 and a corresponding motor. In certain embodiments, the user interface 104 may include any suitable type of display, such as any number of light emitting diodes (LEDs), a liquid crystal display (LCD), plasma display, and so forth. For example, the LEDs may illuminate in particular colors to provide an indication to a user of the operational state of the drive module 100 and the corresponding motor. Additionally or alternatively, the user interface 104 may include a touch-sensitive mechanism (e.g., a touch screen) that may serve as part of a control interface for the drive module 100.

The drive module 100 may also include any number of data and/or power interfaces, such as hybrid connectors 106, coupled (e.g., mounted, fastened, and so forth) to the housing 102 (e.g., the body portion 102A of the housing 102). The hybrid connectors 106 may enable data communication between the drive module 100 and external devices (e.g., another drive module, a power interface module, and so forth) and may transfer power between the drive module 100 and the external devices (e.g., another drive module, a power interface module, and so forth). For example, the hybrid connectors may include an Ethernet interface to communicate via various industrial data exchange protocols. The Ethernet capability allows the drive module 100 to be integrated into an Ethernet/IP infrastructure of an industrial automation system. The communication may follow any desired protocol, such as Ethernet/IP, DeviceNet, high speed drive serial interface (HSDSI), Modbus, and so forth. The hybrid connectors may also provide DC power transfer.

The drive module 100 may also include any number of input/output (I/O) ports, such as I/O port 108. The I/O port 108 may be a communication interface and may couple to other peripheral components such as input devices (e.g., keyboard, mouse, and so forth), sensors, I/O modules, and so forth. For example, a connected I/O module may permit the drive module 100 (e.g., control circuitry 14) to communicate or interact with other devices in the industrial automation system.

The drive module 100 may also include a housing extension (e.g., adapter 110). The adapter 110 may be coupled to the housing 102 at an opposite end from the end cap portion 102B. The adapter 110 may couple the housing 102 to the motor. The adapter 110 may be shaped according to a particular frame size of the motor. The adapter 110 provides an interface to couple the drive module 100 in-line with the motor. For example, the adapter may couple the body portion 102A of the housing 102 to the motor and a rotational axis of the shaft of the motor may be parallel with the longitudinal axis of the housing 102. Additionally or alternatively, the rotational axis of the motor shaft may be aligned with the longitudinal axis of the housing 102. The adapter 110 may be coupled to the housing 102 at a first end and may be coupled to the motor at a second end, opposite of the first end, such that the adapter 110 is disposed between the housing 102 and the motor. In certain embodiments, the second end of the adapter 110 may be shaped and/or sized according to the frame size of the motor. Additionally or alternatively, a size and/or shape of the first end of the adapter 110 may be independent of the frame size of the motor. That is, the first end of the adapter 110 may have a same size and/or shape regardless of the frame size of the motor. In some embodiments, the first end of the adapter 110 may be larger than the second end of the adapter 110 or the first end of the adapter 110 may be smaller than the second end of the adapter 110.

Figure 3:
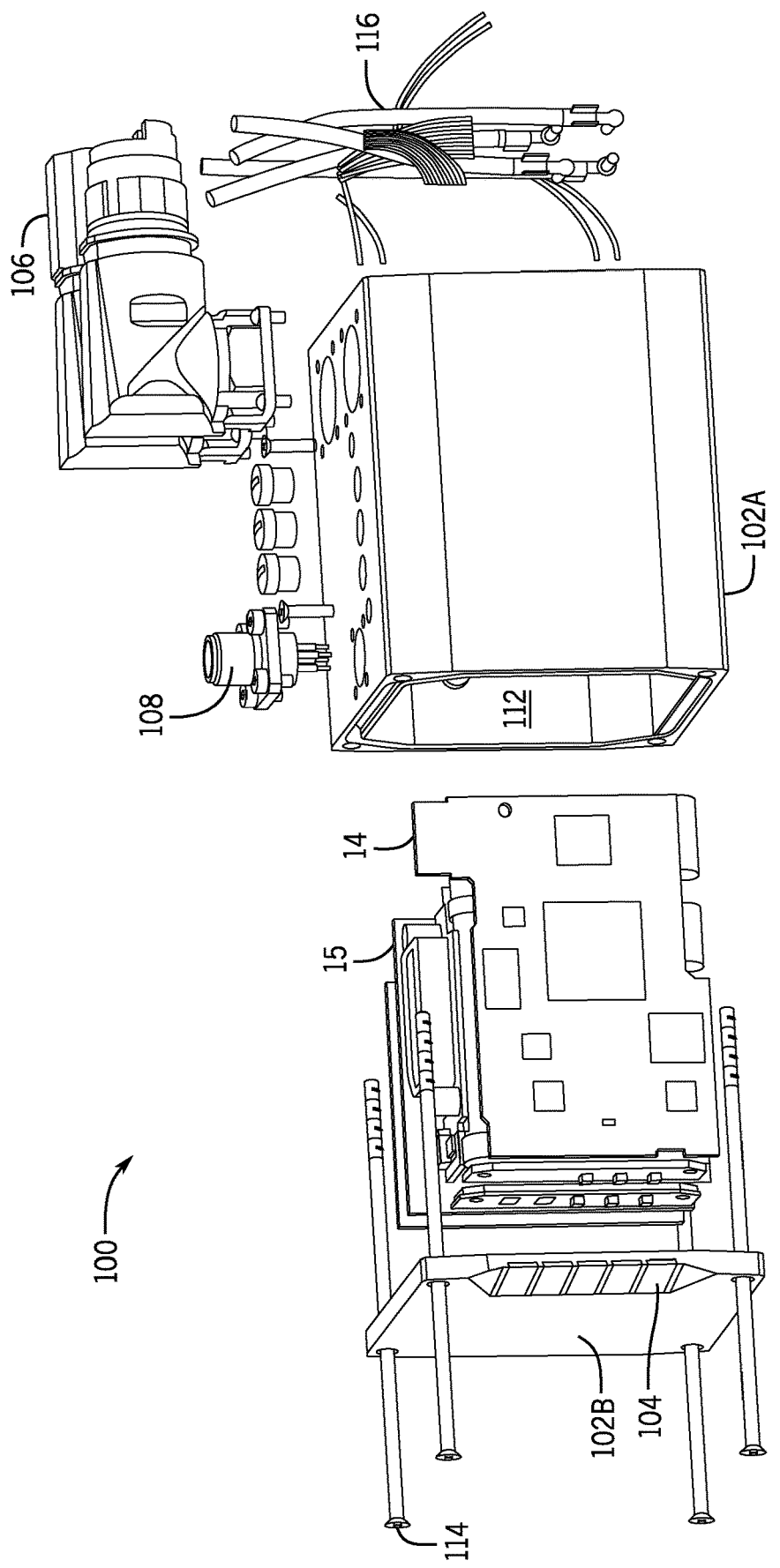
FIG. 3 is an exploded view of the drive module of FIG. 2, in accordance with embodiments described herein.
Figure 4A:
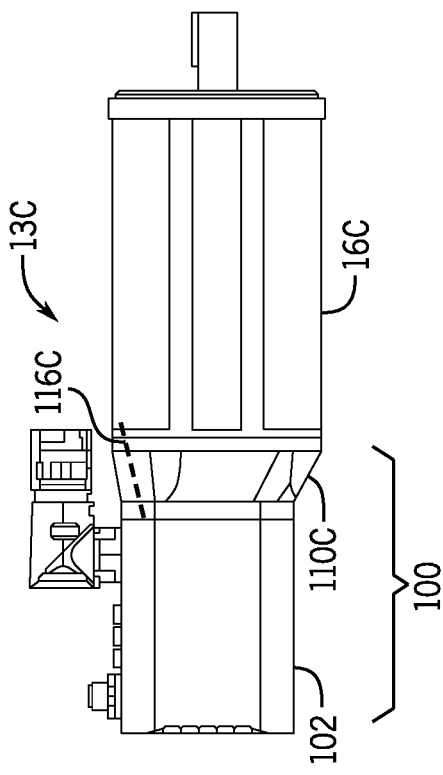
FIG. 4A is a perspective view of a first example embodiment of a motor-drive assembly incorporating the drive module of FIG. 2, in accordance with embodiments described herein.
Figure 4C:
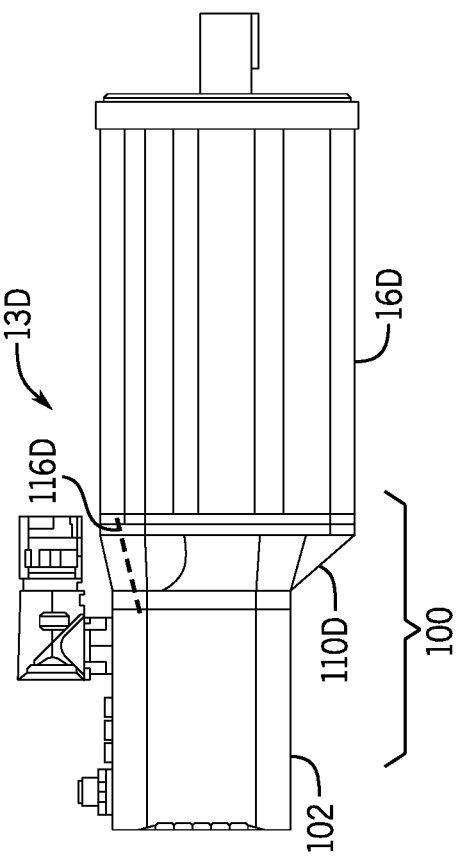
FIG. 4C is a perspective view of a third example embodiment of a motor-drive assembly incorporating the drive module of FIG. 2, in accordance with embodiments described herein.
Figure 4B:
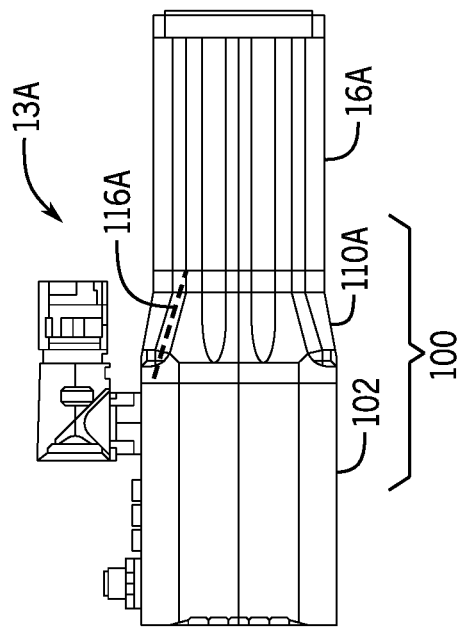
FIG. 4B is a perspective view of a second example embodiment of a motor-drive assembly incorporating the drive module of FIG. 2, in accordance with embodiments described herein.
Figure 4D:
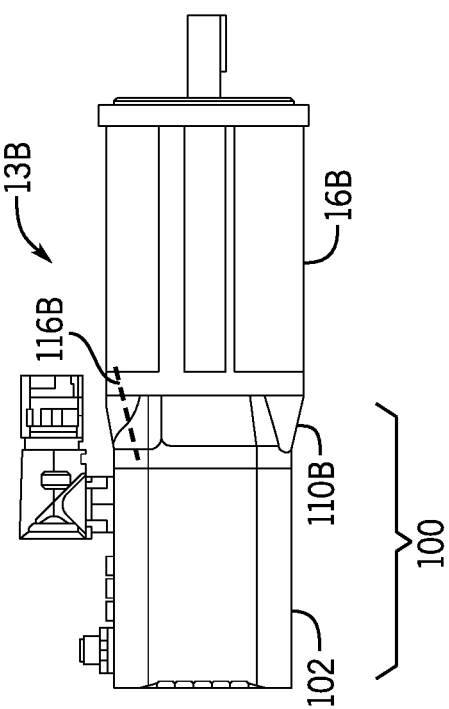
FIG. 4D is a perspective view of a fourth example embodiment of a motor-drive assembly incorporating the drive module of FIG. 2, in accordance with embodiments described herein.

FIG. 3 illustrates an exploded view of the drive module 100. The housing 102 may include an interior cavity 112. The cavity 112 may extend along a length of the body portion 102A. For example, the cavity 112 may extend from a first end adjacent the end cap portion 102B to an opposite end adjacent the adapter 110. The end cap portion 102B may couple to the body portion 102A at the first end and may cover an opening of the body portion 102A to enclose the cavity 112. For example, the end cap portion 102B may couple to the body portion 102A via any number of fasteners, such as the illustrated fasteners 114, which extend into and are received by the body portion 102A. For example, the body portion 102A may include a number of bores extending along a length of the body portion 102A. The bores may receive the fasteners 114. The fasteners 114 may extend through the body portion 102A and may couple to the adapter 110. As such, the fasteners 114 may couple the body portion 102A, the end portion 102B, and the adapter 110. As will be appreciated by those skilled in the art, in many applications, the drive module 100 may inter-operate with other machines, robots, conveyers, control equipment, and so forth (not separately shown) in an overall automation, packaging, material handling or other application.

The drive module 100 may include circuitry designed for starting, driving, braking, actuating, and any other suitable control of the motor. The circuitry may be designed for any suitable power rating, often referred to by the frame size of the motor. Remote control, monitoring functions, and coordinated operation of the drive module 100 may be performed via a network connection according to any suitable connection protocol, such as standard industrial protocols, Ethernet protocols, Internet protocols, wireless protocols, and so forth. All of the circuitry operates under the control of control circuitry 14. The control circuitry 14 typically carries out predefined control routines, or those defined by an operator, based upon parameters set during commissioning of the equipment and/or parameters sensed and fed back to the control circuitry 14 during operation. The control circuitry 14 may include any number of circuit boards and the circuit boards may mount in a frame to the end cap portion 102B. The control circuitry 14 may be disposed in the interior cavity 112 of the body portion 102A. The control circuitry 14 may include an interface to transfer control, feedback, and other signals to the motor and/or external devices. Many different control schemes and functions may be implemented by the control circuitry 14 and programs for such operation may be stored on a non-transitory computer-readable medium. The control circuitry 14 may monitor the operation of the motor and/or the drive module 100. For example, the control circuitry 14 may receive collected data (e.g., voltages, speeds, temperatures, pressures, and so forth) from any number of sensors.

The control circuitry 14 may control operation of other circuitry of the drive module 100, such as power circuitry 15. For example, the control circuitry 14 may send signals to switches of the power circuitry 15. The signals may cause switches to rapidly close and open, resulting in a three-phase waveform output. The power circuitry 15 may include any number of circuit boards and the circuit boards may mount to the frame with the control circuitry 14 and to the end cap portion 102B. The power circuitry 15 may be designed for any suitable power rating and may be based on the frame size of the motor. The power circuitry 15 may receive three-phase power and output three-phase power to the motor. For example, the power circuitry 15 may include any number of components, such as rectifiers, inverters, converters, switches, and so forth that may receive three-phase AC power, may rectify the three-phase AC power to DC power (e.g., a DC voltage waveform), and may invert and may generate a three-phase output AC power waveform at a desired frequency for actuating a motor connected to the drive module 100. In certain embodiments, the power circuitry 15 may receive input DC power and may convert the input DC power and may generate the three-phase output AC power waveform. For example, an external device, such as a power interface module, may be coupled to the drive module 100 and may include any number of rectifiers, inverters, converters, switches, and so forth that may receive three-phase AC power as an input, may rectify the three-phase AC power to DC power (e.g., a DC voltage waveform)

and may output the generated DC power for the power circuitry 15 of the drive module 100. The power circuitry 15 may receive the DC power and may generate three-phase output AC power for operation of the motor. The control circuitry 14 may control the speed of the motor by controlling switches within the power circuitry 15, thereby adjusting power supplied to the motor. The control circuitry 14 may include a memory, such as memory 22 in FIG. 1, to store instructions to control the speed, torque, and so forth of the motor and may include any number of processors, such as processor 24 in FIG. 1, to execute the instructions. The memory may be a tangible, non-transitory, computer-readable medium and may include random-access memory, read-only memory, and so forth.

The drive module 100 may also include any number of wire harnesses 116. The wire harnesses 116 may be disposed in the cavity 112 of the body portion 102A of the housing 102. The wire harnesses 116 may connect the control circuitry 14 and/or the power circuitry 15 to the hybrid connectors 106. Additionally or alternatively, the wire harnesses 116 may connect the control circuitry 14 and/or the power circuitry 15 to circuitry of the motor. The control circuitry 14, the power circuitry 15, and/or the wire harnesses 116 may be potted in the cavity 112 and the potting material may retain the control circuitry 14, the power circuitry 15, and/or the wire harnesses 116 in place in the cavity 112. The housing 102 may be independent of the frame size and/or power of the motor. As such, the shape and/or the size of the housing 102 may be uniform for any number of different motors.

FIGS. 4A, 4B, 4C, and 4D illustrate a number of example embodiments of motor-drive assemblies 13A, 13B, 13C, 13D including the drive module 100 coupled to a corresponding motor 16A, 16B, 16C, 16D. In the illustrated embodiment, the drive module 100 is coupled in-line with the corresponding motors 16A, 16B, 16C, 16D, however, other configurations are also envisaged. The motor-drive assembly 13A may include motor 16A and motor 16A may be a motor having a 75 millimeter (mm) frame size. The adapter 110A may be sized and/or shaped according to the 75 mm frame size of the motor 16A. In certain embodiments, a first end of the adapter 110A may couple to the housing 102 and a second end of the adapter 110A may couple to the motor 16A. For example, the first end of the adapter 110A may be larger than the second end of the adapter 110A. The motor-drive assembly 13B may include motor 16B and motor 16B may be a motor having a 100 mm frame size. The adapter 110B may be sized and/or shaped according to the 100 mm frame size of the motor 16B. A first end of the adapter 110B may couple to the housing 102 and a second end of the adapter 110B may couple to the motor 16B. For example, the first end of the adapter 110B may be smaller than the second end of the adapter 110B. The motor-drive assembly 13C may include motor 16C and motor 16C may be a motor having a 115 mm frame size. The adapter 110C may be sized and/or shaped according to the 115 mm frame size of the motor 16C. A first end of the adapter 110C may couple to the housing 102 and a second end of the adapter 110C may couple to the motor 16C. For example, the first end of the adapter 110C may be smaller than the second end of the adapter 110C. The motor-drive assembly 13D may include motor 16D and motor 16D may be a motor having a 130 mm frame size. The adapter 110D may be sized and/or shaped according to the 130 mm frame size of the motor 16D. A first end of the adapter 110D may couple to the housing 102 and a second end of the adapter 110D may couple to the motor 16D. For example, the first end of the adapter 110D may be smaller than the second end of the adapter 110D. As such, the adapters 110A, 110B, 110C, 110D may be sized and/or shaped according to a frame size of the corresponding motors 16A, 16B, 16C, 16D in order to be compatible with a motor of a particular frame size. Accordingly, the drive module 100 may be compatible with a wide range of motors of various frame sizes by exchanging or replacing the adapter 110. The adapters 110A, 110B, 110C, 110D may include a bore therethrough and communication interfaces, such as wire harnesses 116A, 116B, 116C, 116D, may be at least partially disposed in the bore and may provide communication between the drive module 100 (e.g., control circuitry 14, power circuitry 15) and the corresponding motors 16A, 16B, 16C, 16D. In some embodiments, the adapters 110A, 110B, 110C, 110D may provide grounding for the motor-drive assemblies 13A, 13B, 13C, 13D based on providing a connection between the housing 102 and the corresponding motors 16A, 16B, 16C, 16D. While specific motor sizes are described above and depicted in FIGS. 4A-4D, the drive module 100 may be compatible with any number of different motor frame sizes and/or power ratings.

FIG. 5 illustrates another example embodiment of the motor-drive assembly 13E configured for a distributed servo drive (DSD). The DSD enables the drive module 100 to drive a motor that is not directly coupled to the adapter and is instead coupled to the adapter 110E via an intermediate component (e.g., cables, hoses, etc.). The motor-drive assembly 13E may include any number of motor connectors 118 coupled (e.g., fastened, mounted, and so forth) to the adapter 110E. For example, the motor-drive assembly 13E may include a first motor connector 118 that may provide a communication interface for three-phase AC output power at a desired frequency and/or a communication interface for an encoder that may provide data (e.g., feedback signals) to the control circuitry for tracking the speed and/or the position of the motor shaft. In some embodiments, the motor-drive-assembly may include the first motor connector for three-phase AC output power and a second motor connector that may provide the communication interface for the encoder.

FIG. 6 illustrates a flowchart of a process 200 for selecting an adapter for a motor-drive assembly, such as motor-drive assembly 13 in FIG. 1, and then assembling the motor drive assembly. Although the following description of the process 200 is described in a particular order, it should be noted that the process 200 may be performed in any suitable order.

At step 202, a request is received for a drive module for use with a motor-drive assembly. In certain embodiments, the request may include any number of operating characteristics about the motor (e.g., a frame size of the motor, a power rating of the motor, a load of the motor, and so forth). At step 204, operating characteristics of the motor are determined based on the received request. At step 206, an adapter for the drive module is selected from any number of adapters and based on the operating characteristics. For example, the adapter 110A in FIG. 4 may be selected based on a 75 mm frame size for the motor. The adapter may have an interface for coupling to the motor and the interface may be sized and/or shaped according to the operating characteristics of the motor.

At step 208, circuitry (e.g., control circuitry 14, power circuitry 15) is programmed based on the operating characteristics. For example, the power rating for the motor may be one kilowatt and the control circuitry 14 and power circuitry 15 may be programmed to provide appropriate power to the motor. At step 210, the selected adapter may be coupled to the drive module. For example, the control circuitry 14 and power circuitry 15 may be inserted into a housing, such as housing 102, of the drive module. The housing may be uniform for any number of different motor frame sizes and/or motor power ratings. As such, each adapter may have an uniform interface at a first end for coupling to the housing. At step 212, the adapter and corresponding drive module may be coupled to the motor. The drive module may be coupled to the motor via the adapter. For example, the adapter may couple to the motor at a second interface that may be sized and/or shaped according to the operating characteristics (e.g., frame size) of the motor.

The present disclosure includes drive modules for motor-drive assemblies of an industrial automation system. The drive modules may provide power and control operations of the motor. The drive modules may include a housing containing the control circuitry and the power circuitry and the housing may be independent of the frame size and/or power of the motor. As such, the housing may be interchangeable for any motor frame size and/or motor power. The drive modules may also include an adapter that may be shaped and/or sized to connect the drive module to the motor. As such, the size and/or shape of the adapter may be based on the frame size and/or power of the motor. Technical effects of the disclosed techniques include providing interchangeable housings for drive modules of motor-drive assemblies and reducing manufacturing cost by using uniform housings for multiple motor frame sizes and/or motor powers.

While only certain features of the disclosure have been illustrated and described herein, many modifications and changes will occur to those skilled in the art. It is, therefore, to be understood that the appended claims are intended to cover all such modifications and changes as fall within the true spirit of the present disclosure. The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . ." or "step for [perform]ing [a function] . . .", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A drive module for a motor-drive assembly, comprising:
   a housing including a cavity, wherein the housing comprises a visual interface configured to provide an indication of an operational state of a motor of the motor-drive assembly;
   power circuitry disposed within the cavity and configured to:
      convert input DC power to three-phase controlled frequency AC power;
      supply the three-phase controlled frequency AC power to the motor;
   control circuitry disposed within the cavity and configured to apply control signals to control operation of the motor;
   a housing extension configured to couple to a first end of the housing, wherein the housing extension is configured to couple the housing to the motor, wherein the housing extension is removable and sized according to a frame size of the motor; and
   a hybrid connector comprising:
      a power interface configured to transfer power to an external device; and
      a data interface configured to transfer data signals to the external device.

2. The drive module of claim 1, the housing comprising a body portion and an end cap portion opposite to the first end.

3. The drive module of claim 2, wherein the hybrid connector is coupled to the body portion.

4. The drive module of claim 2, wherein the frame size of the motor is one of 75 millimeters (mm), 100 mm, 115 mm, or 130 mm.

5. The drive module of claim 1, wherein the power circuitry and the control circuitry are potted in the housing.

6. The drive module of claim 1, wherein the housing extension and the housing are mounted in-line with the motor.

7. The drive module of claim 1, comprising a motor connector, the motor connector configured to transfer data signals associated with the motor between the control circuitry and a second external device.

8. The drive module of claim 7, wherein the motor connector is coupled to the housing extension.

9. A motor-drive assembly, comprising:
   a motor;
   a drive module mounted in-line with the motor, comprising:
      a housing including a cavity, wherein the housing comprises a visual interface configured to provide an indication of an operational state of the motor;
      power circuitry configured to convert incoming power to three-phase controlled frequency AC power and configured to supply the three-phase controlled frequency AC power to the motor, wherein the power circuitry is disposed in the cavity;
      control circuitry configured to apply control signals to control operation of the motor, wherein the control circuitry is disposed in the cavity; and
      an adapter component configured to couple the drive module and the motor, wherein the adapter component is configured according to a frame size of the motor.

10. The motor-drive assembly of claim 9, wherein a size of the housing is independent of the frame size of the motor.

11. The motor-drive assembly of claim 9, wherein the housing comprises a body portion and an end cap portion.

12. The motor-drive assembly of claim 11, wherein:
   a first end of the adapter component couples to the body portion of the housing; and
   a second end of the adapter component couples to the motor.

13. The motor-drive assembly of claim 12, wherein a set of fasteners couple the end cap portion to the first end of the adapter component.

14. The motor-drive assembly of claim 12, wherein the first end of the adapter component may be smaller than the second end of the adapter component.

15. A method, comprising:
   receiving a request for a drive module for a motor-drive assembly;
   determining a set of operating characteristics associated with a motor of the motor-drive assembly;
   selecting an adapter from a plurality of adapters based on the operating characteristics;

programming circuitry of the drive module based on the operating characteristics;
coupling the adapter to the drive module; and
coupling the drive module to the motor via the adapter.

16. The method of claim 15, wherein the set of operating characteristics comprises a frame size of the motor and a power rating of the motor.

17. The method of claim 16, wherein selecting the adapter based on the operating characteristics comprises selecting the adapter based on the frame size of the motor.

18. The method of claim 16, wherein programming the circuitry of the drive module based on the operating characteristics comprises programming the circuitry of the drive module based on a power rating of the motor.

19. The method of claim 15, wherein a housing of the drive module is independent of the operating characteristics of the motor.

* * * * *